(12) United States Patent
Hsu et al.

(10) Patent No.: US 12,482,662 B2
(45) Date of Patent: Nov. 25, 2025

(54) SYSTEMS AND METHODS FOR PRODUCING EPITAXIAL WAFERS

(71) Applicant: GlobalWafers Co., Ltd., Hsinchu (TW)

(72) Inventors: Chih-Yuan Hsu, Hsinchu (TW); Chun-Chin Tu, Zhubei (TW); Yau-Ching Yang, Hsinchu County (TW); Shih-Chiang Chen, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 352 days.

(21) Appl. No.: 18/168,199

(22) Filed: Feb. 13, 2023

(65) Prior Publication Data

US 2023/0268186 A1    Aug. 24, 2023

Related U.S. Application Data

(60) Provisional application No. 63/268,287, filed on Feb. 21, 2022.

(51) Int. Cl.
*H01L 21/304* (2006.01)
*B24B 37/04* (2012.01)
(Continued)

(52) U.S. Cl.
CPC .......... *H01L 21/304* (2013.01); *B24B 37/042* (2013.01); *H01L 21/02532* (2013.01); *H01L 22/20* (2013.01)

(58) Field of Classification Search
CPC ..... C23F 1/08; C23F 1/02; B08B 3/04; C23C 16/52; C23C 16/56; H01L 21/67161;
(Continued)

(56) References Cited

U.S. PATENT DOCUMENTS 7,731,569 B2 *  6/2010  Fujita .................... B24B 29/005
                                                    451/443
7,808,613 B2    10/2010  Lof
(Continued)

FOREIGN PATENT DOCUMENTS

CN        1936110 B      3/2007
CN      101783288 A      7/2010
(Continued)

*Primary Examiner* — Duy Vu N Deo
(74) *Attorney, Agent, or Firm* — Armstrong Teasdale LLP

(57) ABSTRACT

A method of producing an epitaxial semiconductor wafer includes measuring one or more epitaxial semiconductor wafers to determine an epitaxial deposition layer profile produced by an epitaxy apparatus. The method also includes polishing a semiconductor wafer using a polishing assembly and measuring the polished semiconductor wafer to determine a surface profile of the polished wafer. The method further includes generating a predicted post-epitaxy surface profile of the polished wafer by comparing the surface profile of the polished wafer and the determined epitaxial deposition layer profile produced by the epitaxy apparatus. The method also includes determining a predicted post-epitaxy parameter based on the predicted post-epitaxy surface profile and adjusting, based on the predicted post-epitaxy parameter, a process condition of the polishing assembly.

20 Claims, 9 Drawing Sheets

(51) Int. Cl.
  *H01L 21/02* (2006.01)
  *H01L 21/66* (2006.01)
(58) Field of Classification Search
  CPC ......... H01L 21/67184; H01L 21/67178; H01L 21/304; H01L 21/02532; H01L 22/20; H01L 21/02024; H01L 22/12; H01L 21/0262; H01L 22/10; H01L 21/02658; B24B 37/042; B24B 37/005; B24B 37/08; B24B 49/12; C30B 25/186
  USPC .................................................. 438/690–693
  See application file for complete search history.

(56) References Cited

U.S. PATENT DOCUMENTS

| | | |
|---|---|---|
| 8,932,952 B2 | 1/2015 | Ogata et al. |
| 9,403,257 B2 | 8/2016 | Miura et al. |
| 11,158,549 B2 | 10/2021 | Welsch et al. |
| 2007/0158863 A1 | 7/2007 | Eshleman |
| 2014/0357161 A1 | 12/2014 | Bhagavat et al. |
| 2016/0101502 A1 | 4/2016 | Albrecht et al. |
| 2017/0178890 A1 | 6/2017 | Chu et al. |
| 2018/0151384 A1* | 5/2018 | Zhang .................... H01L 21/304 |
| 2019/0067101 A1* | 2/2019 | Fan ....................... H10D 84/859 |
| 2020/0218169 A1 | 7/2020 | Van Haren et al. |
| 2020/0312671 A1 | 10/2020 | Zhang et al. |

FOREIGN PATENT DOCUMENTS

| | | |
|---|---|---|
| CN | 102089708 A | 6/2011 |
| CN | 110394726 A | 11/2019 |
| DE | 102009004557 A1 | 7/2010 |
| DE | 10200910556 A1 | 9/2010 |
| KR | 1653195 B1 | 9/2016 |
| TW | 201837989 A | 10/2018 |

* cited by examiner

SYSTEMS AND METHODS FOR PRODUCING EPITAXIAL WAFERS

CROSS-REFERENCE TO RELATED APPLICATION

This application claims priority to U.S. Provisional Patent Application No. 63/268,287 filed on Feb. 21, 2022, the disclosure of which is hereby incorporated by reference in its entirety.

FIELD

This disclosure relates generally to the production of epitaxial wafers and, more particularly, to systems and methods for producing epitaxial wafers having controlled flatness.

BACKGROUND

Epitaxial semiconductor wafers are commonly used in the production of integrated circuit (IC) chips on which circuitry are printed. The circuitry is first printed in miniaturized form onto surfaces of the epitaxial wafers. The wafers are then broken into circuit chips. To ensure that this miniaturized circuitry can be properly printed over the entire surface of the wafer, the front and back surfaces of the epitaxial wafer must generally be free from defects, extremely flat, and parallel with each other. Further, ICs are rapidly becoming more miniaturized, and this trend continues to impose strict requirements related to acceptable epitaxial wafer flatness parameters such as, for example, site backside ideal plane/range (SBIR), global backside ideal plane/range (GBIR), site frontside least squares focal plane range (SFQR), and edge site frontside least squares focal plane range (ESFQR).

Semiconductor substrate wafers are used as starting materials in the production of epitaxial wafers and are initially obtained from a single crystal ingot of suitable semiconductor material (e.g., silicon). Substrate wafers may be sliced from the ingot using, for example, a wire saw. Grinding and polishing processes are commonly used to improve flatness and parallelism of the front and back surfaces of the substrate wafer after the wafer is cut from an ingot. For example, a substrate wafer may first be polished using a double-sided polishing process, where the front and back surfaces of the wafer are polished simultaneously to improve flatness and parallelism of both surfaces. The double-side polished wafer may then be polished using a single-side polishing process, where only one surface (e.g., the front surface) of the wafer is polished.

Polished wafers then undergo epitaxial processes (or "epitaxy") to produce epitaxial wafers. For example, epitaxial chemical vapor deposition (CVD) is a process for forming epitaxial wafers and involves growing a thin layer of material on a polished semiconductor wafer so that the lattice structure is identical to that of the wafer. Epitaxial CVD is widely used in semiconductor wafer production to build up epitaxial layers such that devices can be fabricated (e.g., circuitry can be printed) directly on the epitaxial layer. During epitaxial CVD, a polished semiconductor wafer may be heated to a suitable temperature in a deposition chamber of an epitaxial reactor, and deposition gases (e.g., a vaporous silicon source gas, such as silane or a chlorinated silane) may be passed through the chamber to deposit and grow an epitaxial layer of material on the front surface of the polished wafer. A susceptor, which supports the polished wafer in the deposition chamber during the epitaxial deposition, is rotated during the process to allow the epitaxial layer to grow evenly.

The parameters (e.g., flatness) of the epitaxial wafer depend on the process conditions during the polishing and epitaxial processes. In some instances, the process conditions during polishing or epitaxy may lead to unacceptable flatness of the epitaxial wafer. For example, polishing processes may cause the profile of the substrate wafer to change near the edge of the wafer due to an uneven distribution of mechanical and/or chemical forces near the edge. The thickness profile at the peripheral edge of the wafer may be reduced, i.e., "edge roll-off" may be observed. Edge roll-off reduces the portion of the wafer available for device fabrication. Further, various process conditions of epitaxial processes such as, for example, temperature gradian across the surface of the wafer, gas flow, and susceptor design, affect the uniformity of epitaxial growth rates across the surface of the wafer. Deviations among local growth rates on the surface of the wafer may cause an uneven thickness distribution of the epitaxial layer, causing the flatness of the epitaxial wafer to be deteriorated and to fail to meet targeted specifications.

The process conditions during polishing and epitaxy may be adjusted so that unacceptable wafer parameters do not result from each of these processes. For example, polishing process conditions may be adjusted to minimize edge roll-off while maintaining acceptable flatness of the polished wafer. Epitaxial process conditions may also be adjusted to provide more uniform epitaxial growth rates across the surface of the wafer. However, these adjustments are generally made to optimize a surface profile of the wafer obtained by each step, independent of a surface profile that is obtained by a preceding or subsequent step. Moreover, it has been observed that epitaxial wafers, even if formed from polished wafers that have acceptable post-polish flatness and edge-roll off parameters, may not have acceptable flatness post-epitaxy if the surface profile of the polished wafer does not match with the profile of the deposited epitaxial layer. The loss will not be realized until after irreversible epitaxial processing and the epitaxial wafer must be scrapped, causing unacceptable yield loss.

Accordingly, there is a need for a process for producing an epitaxial wafer that facilitates controlling the flatness of the epitaxial wafer.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a method of producing an epitaxial semiconductor wafer includes measuring one or more epitaxial semiconductor wafers to determine an epitaxial deposition layer profile produced by an epitaxy apparatus. The method also includes polishing a semiconductor wafer using a polishing assembly and measuring the polished semiconductor wafer to determine a surface profile of the polished wafer. The method further includes generating a predicted post-epitaxy surface profile of the polished wafer by comparing the surface profile of the polished wafer and the determined epitaxial deposition layer profile produced by the epitaxy apparatus. The method also includes determining a predicted post-epitaxy parameter based on the predicted post-epitaxy surface profile and adjusting, based on the predicted post-epitaxy parameter, a process condition of the polishing assembly.

In another aspect, a method of producing an epitaxial semiconductor wafer includes measuring one or more epitaxial semiconductor wafers to determine a thickness profile of an epitaxial deposition layer produced by an epitaxy apparatus. The method also includes polishing a semiconductor wafer using a polishing assembly and measuring the polished semiconductor wafer to determine a near-edge surface profile of the polished wafer. The method further includes determining a predicted post-epitaxy near-edge parameter of the polished wafer by comparing the near-edge surface profile of the polished wafer and the thickness profile produced by the epitaxy apparatus. The method also includes determining whether the predicted post-epitaxy near-edge parameter meets a predetermined parameter specification and, if the predicted post-epitaxy near-edge parameter does not meet the predetermined parameter specification, adjusting a process condition of the polishing assembly to control a parameter of the near-edge surface profile of the polished wafer.

In another aspect, a method of producing an epitaxial semiconductor wafer includes measuring one or more epitaxial semiconductor wafers to determine a thickness profile of an epitaxial deposition layer produced by an epitaxy apparatus. The method also includes polishing a semiconductor wafer using a polishing assembly and measuring the polished semiconductor wafer to determine a surface profile of the polished wafer. The method also includes superimposing the thickness profile of the epitaxial deposition layer on the surface profile of the polished wafer to determine a predicted post-epitaxy parameter of the polished wafer. The predicted post-epitaxy parameter is a flatness parameter including at least one of SBIR, GBIR, SFQR, and ESFQR. The method further includes determining whether the predicted post-epitaxy parameter meets a predetermined parameter specification and, if the predicted post-epitaxy parameter does not meet the predetermined parameter specification, adjusting a process condition of the polishing assembly.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
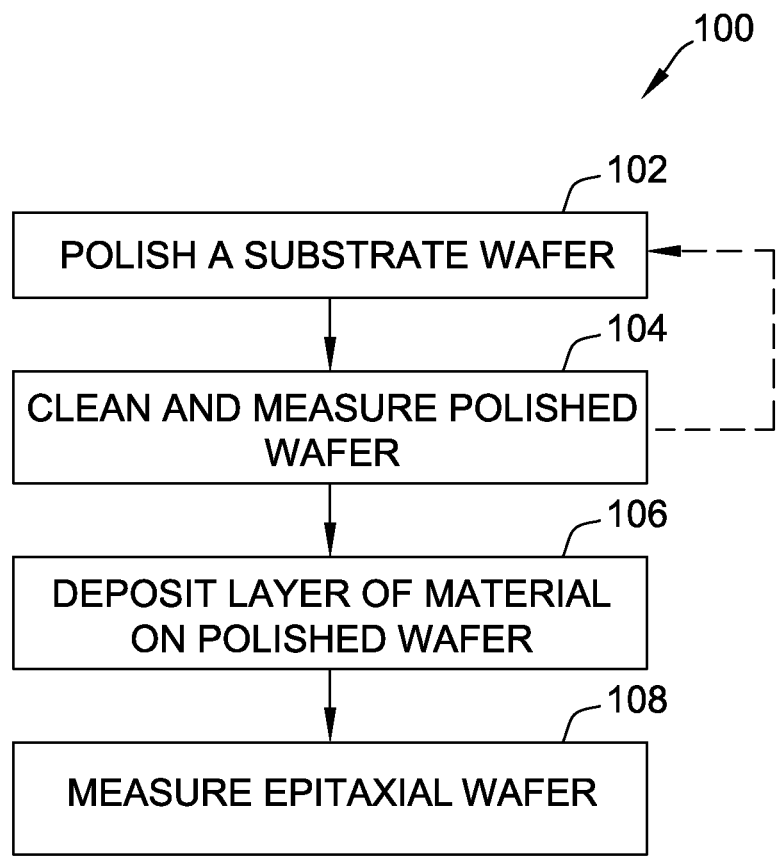
FIG. 1 is an example process for producing an epitaxial wafer.

Referring to FIG. 1, an example process 100 for producing an epitaxial wafer is shown. At step 102, a substrate wafer is polished to obtain a polished wafer. Suitable substrate "wafers" (which may also be referred to as "semiconductor wafers" or "silicon wafers") include single crystal silicon substrate wafers, such as, for example, substrate wafers obtained by slicing the wafers from ingots formed by the Czochralski method or the float zone method. Each substrate wafer includes a central axis, a front surface, and a back surface parallel to the front surface. The front and back surfaces are generally perpendicular to the central axis. A circumferential edge joins the front and back surfaces. The substrate wafers may be any diameter suitable for use by those of skill in the art including, for example, 200 mm, 300 mm, or 450 mm diameter wafers.

Figure 2:
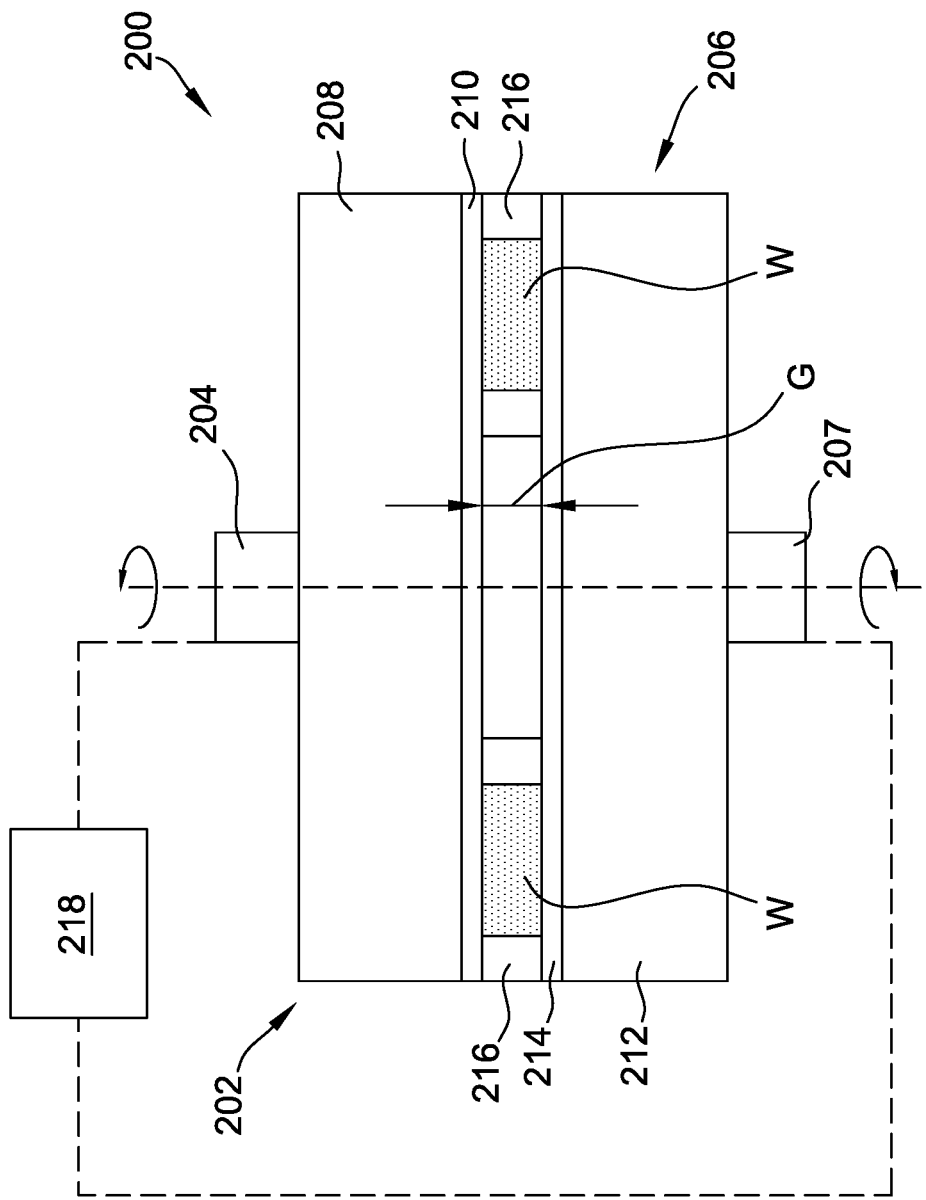
FIG. 2 is a partial schematic elevation of a double-side polishing assembly.

The step of polishing 102 a substrate wafer may include polishing (e.g., rough polishing) the front and back surfaces of the substrate wafer simultaneously using a double-side polishing (DSP) assembly. Referring to FIG. 2, a portion of an example DSP assembly used to rough polish the front and back surfaces of a substrate wafer is shown schematically and indicated generally at 200. It is contemplated that other types of polishing apparatus may be used.

As shown in FIG. 2, DSP assembly 200 includes a first polishing head 202 attached to a first shaft 204 and a second polishing head 206 attached to a second shaft 207. The first shaft 204 rotates the first polishing head 202, and the second shaft 207 rotates the second polishing head 206. The rotational speed of the first polishing head 202 may be the same as or different from the rotational speed of the second polishing head 206. The first polishing head 202 includes a first plate 208 and a first polishing pad 210 attached to the first plate 208. The second polishing head 206 includes a second plate 212 and a second polishing pad 214 attached to the second plate 212. During polishing, one or more wafers W are inserted into circular openings of generally annular carrier plates 216 and the wafers W and carrier plates 216 are positioned in between the first and second polishing pads 210 and 214. Carrier plates 216, and the wafers W, may be moveable between the polishing pads 210 and 214 using, for example, a rolling apparatus (not shown).

DSP assembly 200 applies a force to the polishing heads 202 and 206 to move the polishing heads 202 and 206 vertically relative to the wafers W and carrier plates 216. Vertical movement of the polishing heads 202 and 206 toward wafers W and carrier plates 216 causes the polishing pads 210 and 214 to be pressed against carrier plates 216 and into polishing engagement with the respective surfaces of wafers W. As DSP assembly 200 increases the force applied to cause vertical movement of the polishing heads 202 and 206 toward wafers W and carrier plates 216, the polishing pressure between the polishing pads 210 and 214 and the respective surfaces of wafers W increases. The carrier plates 216 restrict vertical movement of the polishing heads 202 and 206 and define a gap G between polishing heads 202 and 206. The amount of polishing pressure that can be applied between the polishing pads 210 and 214 and the respective surfaces of wafers W is limited by the gap G. Increasing a thickness of the carrier plates 216 also increases a thickness of the gap G, and as a result further limits the polishing pressure between the polishing pads 210 and 214 and the respective surfaces of the wafers W.

The rough polish of wafers W using DSP assembly 200 may be achieved by, for example, chemical-mechanical planarization (CMP). CMP typically involves the immersion of wafers W in an abrasive slurry. DSP assembly 200 includes a slurry supply system (not shown) that supplies the slurry to wafers W between the first and second polishing pads 210 and 214 during polishing. Suitable slurries that may be used alone or in combination in the polishing process include a first polishing slurry comprising an amount of silica particles, a second polishing slurry that is alkaline (i.e., caustic) and typically does not contain silica particles, and a third polishing slurry that is deionized water.

DSP assembly 200 may also include a preheating system (not shown) that supplies a preheating fluid to the first and second polishing heads 202 and 206 prior to polishing. The preheating fluid typically includes a non-abrasive fluid, such as deionized water, that is substantially free of silicon dioxide. The preheating system supplies the preheating fluid at a predetermined temperature and flow rate to polishing heads 202 and 206. The preheating fluid is channeled to polishing pads 210 and 214 for a predetermined time, and the shafts 204 and 207 simultaneously rotate the polishing heads 202 and 206 to coat the preheating fluid on the polishing pads 210 and 214, respectively. The preheating fluid may increase the temperature of the polishing pads 210 and 214 to less than or equal to a targeted polishing temperature prior to polishing using DSP assembly 200.

DSP assembly 200 also includes a controller 218 that allows an operator to select and control process conditions of DSP assembly 200 during polishing. For example, the operator may select rotational speeds of one or both of the polishing heads 202 and 206, and may adjust the polishing pressure between the polishing pads 210 and 214 and the respective surfaces of wafers W by controlling vertical movement of the polishing heads 202 and 206. The operator may also control, via the controller 218, process conditions that include, for example, a flowrate of the slurry supplied during polishing, a composition of the polishing slurry, a polishing process time, a polishing process temperature, and a rotational speed of carrier plates 216 during polishing.

During operation, the wafers W are positioned in carrier plates 216, and the wafers W and the carrier plates 216 are positioned within DSP assembly 200 between polishing pads 210 and 214. The polishing pads 210 and 214 may be preheated prior to positioning of the wafers W and carrier plates 216 using a preheating fluid supplied from the preheating system as described herein. The polishing heads 202 and 206 are moved toward the carrier plates 216 and wafers W and the polishing pads 210 and 214 are pressed against the front and back surfaces of the wafers W. The polishing slurry is channeled to polishing heads 202 and 206 and is applied to polishing pads 210 and 214. The front and back surfaces of the wafers W are polished by rotating the polishing heads 202 and 206. Specifically, the rotating polishing pads 210 and 214 work the polishing slurry against the front and back surfaces of the wafers W to remove material from the surfaces of the wafers W, resulting in flatter and/or smoother surfaces. The carrier plates 216 may also be moved during polishing to facilitate removal of material from the surfaces of the wafers W. Targeted surface profiles of the surfaces of the wafers W (e.g., a desired flatness or smoothness) may be achieved by adjusting, via the controller 218, polishing process conditions such as, for example, the rotational speeds of one or both of the polishing heads 202 and 206, the polishing pressure between the polishing pads 210 and 214 and the respective surfaces of wafers W, a flowrate of the polishing slurry, a composition of the polishing slurry, a polishing process time, a polishing process temperature, and a rotational speed of carrier plates 216 during polishing. In addition, targeted surface profiles of the surfaces of the wafers W may be achieved by adjusting a thickness of the carrier plates 216 to increase or decrease a thickness of gap G, thereby adjusting a polishing pressure exerted by polishing pads 210 and 214 on the respective surfaces of the wafers W.

Referring back to FIG. 1, the step of polishing 102 the substrate wafer may additionally or alternatively include subjecting the wafer to one or more single-side polishing operations in which the front surface of the wafer, but not the back surface, is polished to improve flatness parameters or to smooth the front surface and remove handling scratches. To carry out this operation, a single-side polishing (SSP) assembly, such as SSP assembly 300 (shown in FIG. 3), may be used. Typically, a wafer that has previously been rough polished (e.g., using DSP assembly 200) so that it has rough polished front and back surfaces is first subjected to an intermediate SSP operation using an SSP assembly with a conventional polishing slurry containing abrasive particles and a chemical etchant. The wafer may then be subjected to a finishing SSP operation in which the front surface of the wafer is finish polished to remove fine or "micro" scratches caused by large size colloidal silica, such as Syton® from DuPont Air Products Nanomaterials, LLC, in the intermediate SSP step and to produce a highly reflective, damage-free front surface of the wafer. The intermediate SSP operation generally removes more material from the front surface of the wafer than the finishing SSP operation. The wafer may be finish polished in the same SSP assembly used to intermediate polish the wafer (e.g., SSP assembly 300 shown in FIG. 3 and described herein). However, a separate SSP assembly may also be used for the finish polishing operation. A finish polishing slurry typically has an ammonia base and a reduced concentration of colloidal silica. The finish polishing slurry is worked against the front surface of the wafer to remove any remaining scratches and haze so that the front surface of the wafer is generally highly-reflective and damage free. In between any of the polishing operations included with the polishing step 102, the wafer may be rinsed and dried, and may be subjected to a cleaning operation, for example, a wet bench or spin cleaning operation.

Figure 3:
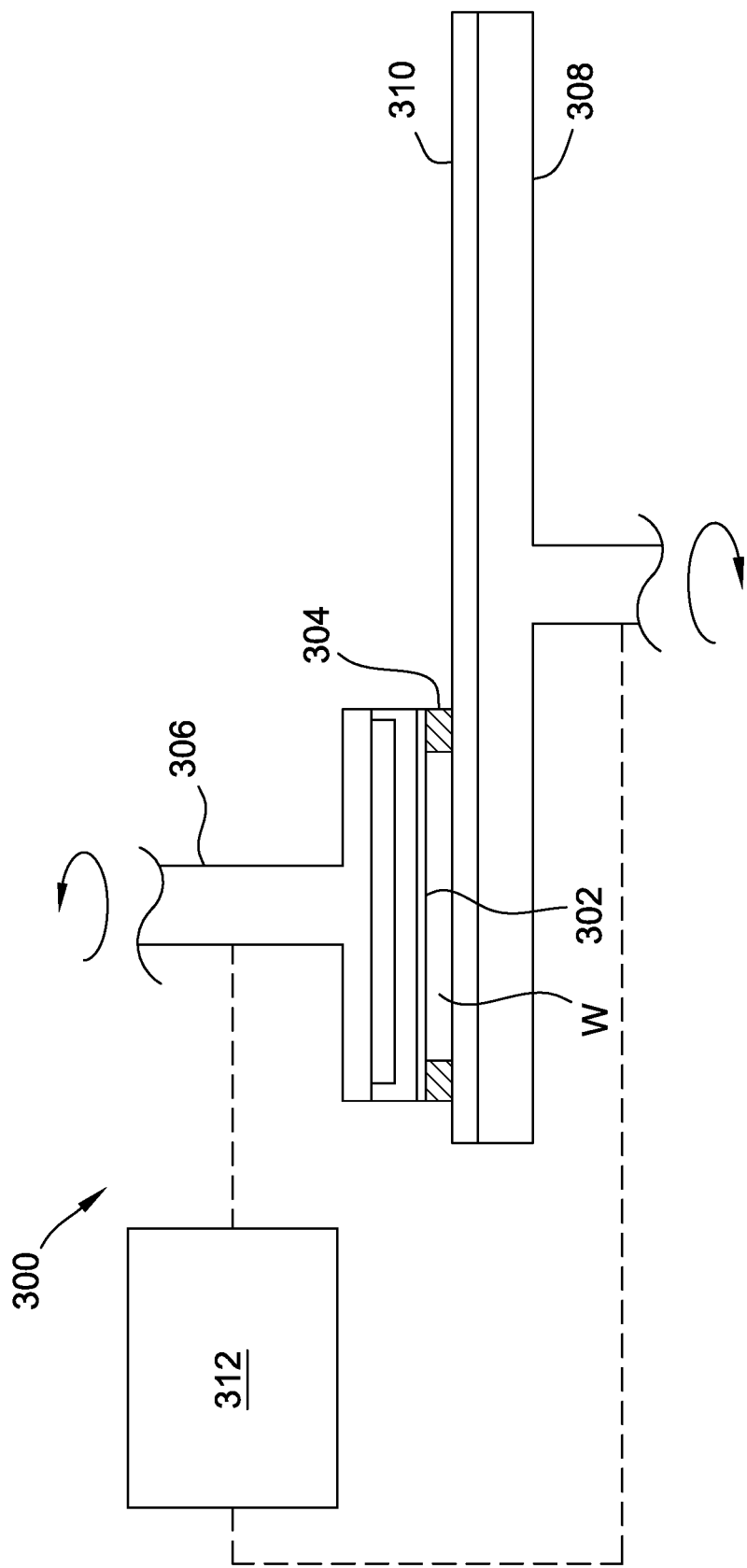
FIG. 3 is a partial schematic elevation of a single-side polishing assembly.

Referring to FIG. 3, a portion of an example SSP assembly is shown schematically and indicated generally at 300. The SSP assembly 300 is used to polish a front surface of one or more wafers W. It is contemplated that other types of polishing apparatus may be used.

The SSP assembly 300 includes a wafer holding mechanism, e.g., a template comprising a backing film 302 and a retaining ring 304, a polishing head 306, and a turntable 308 having a polishing pad 310. The backing film 302 is located between a polishing head 306 and the retaining ring 304, which receives a wafer W. The backing film is saturated with water or other suitable liquid to mount the wafer W to the polishing head 306 using liquid surface tension as described below. The retaining ring 304 has at least one circular opening to receive the wafer W to be polished therein. The wafer W may have been previously been double-side polished using, for example, DSP assembly 200 (shown in FIG. 2). While a single wafer W is shown in FIG. 3, SSP assembly 300 may be used to polish multiple wafers.

The wafer W is attached to and retained against the polishing head 306 by surface tension. To form the surface tension, the wet saturated backing film 302 is attached to the polishing head 306 with a pressure sensitive adhesive. The backing film 302 and retaining ring 304 form a template or "wafer holding template." The backing film 302 is generally a soft polymer pad or other suitable material.

The wafer W is then pressed into the wet saturated backing film 302 to remove or squeeze out the majority of the water or other suitable liquid. Squeezing out the water causes the wafer W to be retained on the backing film 302 by surface tension and the atmospheric pressure on the exposed surface of the wafer W. This squeezing out of the water mounts the wafer W to the polishing head 306.

A portion of the polishing head 306 may be flexible enough to deform in response to a change in pressure applied to the polishing head 306, and stiff enough not to deform when the wafer W is pressed into the wet saturated template. The surface tension provides a constant retaining force over the surface of the wafer W. This constant retaining force causes any deformation of the polishing head 306 adjacent to the wafer W to be directly translated into proportional deformation of the wafer W.

The SSP assembly 300 applies a force to the polishing head 306 to move the polishing head 306 vertically to raise and lower the polishing head 306 with respect to the wafer W and the turntable 308. An upward force raises the polishing head 306, and a downward force lowers the polishing head 306. The downward vertical movement of the polishing head 306 against the wafer W provides the polishing pressure to the wafer W to urge the wafer W into the polishing pad 310 of the turntable 308. As the SSP assembly 300 increases the downward force, the polishing head 306 moves vertically lower to increase the polishing pressure.

A portion of the polishing head 306 and polishing pad 310 and turntable 308 are rotated at selected rotational speeds by a suitable drive mechanism (not shown) as is known in the art. The rotational speeds of the polishing pad 310 and the turntable 308 may be the same or different. The SSP assembly 300 includes a controller 312 that allows the operator to select rotational speeds of one or both of the polishing head 306 and the turntable 308, and the downward force applied to the polishing head 306. The operator may also control, via the controller 312, process conditions that include, for example, a flowrate of the slurry supplied during polishing, a composition of the polishing slurry, a polishing process time, and a polishing process temperature.

During operation, the wafer W is positioned within SSP assembly 300 between backing film 302 and polishing pad 310, and is mounted on polishing head 306. The polishing head 306 is moved vertically lower to increase the polishing pressure exerted by polishing head 306 on the wafer W. A polishing slurry, such as an intermediate polishing slurry or a finish polishing slurry, is applied to the polishing pad 310 for polishing interaction between the polishing pad 310 and the front surface of the wafer W. The front surface of the wafer W is polished by rotating the polishing head 306 and turntable 308. Specifically, the rotating polishing head 306 and turntable 308 work the polishing slurry between the polishing pad 310 and the front surface of the wafer W to remove material from the front surface of the wafer W, resulting in a flatter and/or smoother surface. Targeted surface profiles of the front surface of the wafers W (e.g., a desired flatness or smoothness) may be achieved by adjusting, via the controller 312, polishing process conditions such as, for example, the rotational speeds of one or both of the polishing head 306 and turntable 308, the polishing pressure exerted by the polishing head 306, a flowrate of the polishing slurry, a composition of the polishing slurry, a polishing process time, and a polishing process temperature.

Referring back to FIG. 1, after polishing 102 the substrate wafer to obtain a polished wafer, the process 100 proceeds at step 104 where a surface profile of the polished wafer is measured. The polished wafer may optionally be cleaned before measurement. Example cleaning operations include wet bench cleaning or spin cleaning. Wet bench cleaning may include contacting the polished wafer with SC-1 cleaning solution (i.e., ammonium hydroxide and hydrogen peroxide), optionally, at elevated temperatures (e.g., about 50° C. to about 80° C.). Spin cleaning includes contact with a HF solution and ozonated water and may be performed at room temperature.

In general, the surface profile of the polished wafer is measured to determine whether the polished wafer has acceptable wafer parameters. A "wafer parameter" is generally understood to mean a parameter or a quantity that is used to assess a quality of a polished wafer and, more specifically, to assess whether the wafer is suitable for use in device fabrication. For example, polished wafers are commonly used in the production of integrated circuit (IC) chips on which circuitry are printed. The circuitry is printed as identical integrated circuits ("die") in miniaturized form onto surfaces of the wafers in a multi-stage fabrication process. Specifically, the process includes various stages of electron beam-lithographic or photolithographic processing steps ("lithography") and chemical or physical processing steps (e.g., CMP, etching, and passivation). At each stage, a new pattern layer is added to the surface of the wafer, or an existing layer is modified. Precise alignment of the layers ("overlay") is critical for end performance of the chips. Assessing one or more wafer parameters may help determine whether the polished wafer is at risk of creating overlay error during fabrication. Identifying wafer parameters that indicate potential overlay errors before irreversible lithographic processing occurs facilitates reducing manufacturing costs and salvaging wafers that can be re-polished to meet target specifications. In this respect, if it is determined that a polished wafer measured at step 104 has one or more unacceptable wafer parameters, step 102 may be repeated before the process proceeds to step 106. Process conditions during polishing using, for example, DSP assembly 200 and/or SSP assembly 300 may be adjusted as described above to obtain acceptable wafer parameters.

Conventional metrology tools capable of determining wafer geometry (e.g., KLA-Tencor WaferSight or WaferSight2; Milpitas, California) may be used to measure a surface profile and determine one or more wafer parameters (e.g., shape and/or flatness) of a polished wafer. Shape is the long wavelength component of the wafer geometry in an unchucked state, defined as the deviation of median surface of the wafer relative to a best-fit median surface reference plane. It can be characterized by global parameters such as warp, the sum of the maximum positive and negative deviations from the best-fit plane, and bow, the distance between the surface and the best-fit plane at a center of the wafer. Flatness is the variation of wafer thickness relative to the reference plane. It can be characterized by global parameters, such as global backside ideal plane/range (GBIR), or local parameters, such as site backside ideal plane/range (SBIR) or site frontside least squares focal plane range (SFQR). The surface profile near the peripheral edge of a wafer may also deteriorate during polishing. As used herein, "near-edge" refers to a portion along the wafer near the peripheral edge. For example, for a 300 mm diameter wafer, the near-edge portion of the wafer may be defined as the portion of the wafer that begins at a radial distance of about 120 mm from the central axis of the wafer. Parameters that characterize the surface profile of the polished wafer at the near-edge portion (also referred to as the "near-edge surface profile") are useful to assess whether the near-edge portion of the wafer is suitable for device fabrication. For example, "edge roll-off" may be observed to determine whether there is unacceptable reduction of the thickness profile at the near-edge portion of the wafer. Edge roll-off may be calculated using conventional metrology tools, described herein, and may also be referred to as a "roll-off amount." Other parameters may also be used to assess near-edge quality of the wafer, such as edge site frontside least squares focal plane range (ESFQR), and can be determined using conventional metrology tools as described herein.

After the polished wafer is measured at step 104, and it is determined that the polished wafer has acceptable wafer parameter(s), the process 100 proceeds at step 106 in which a layer of material is deposited and/or grown on a surface of the polished wafer. For example, a layer of material may be deposited on the polished wafer using a chemical vapor deposition (CVD) process, such as epitaxial CVD or polycrystalline CVD. However, various processes may be performed to deposit and/or grow a layer of material on a polished wafer, and the present disclosure is not limited to any specific process described herein.

Figure 4:
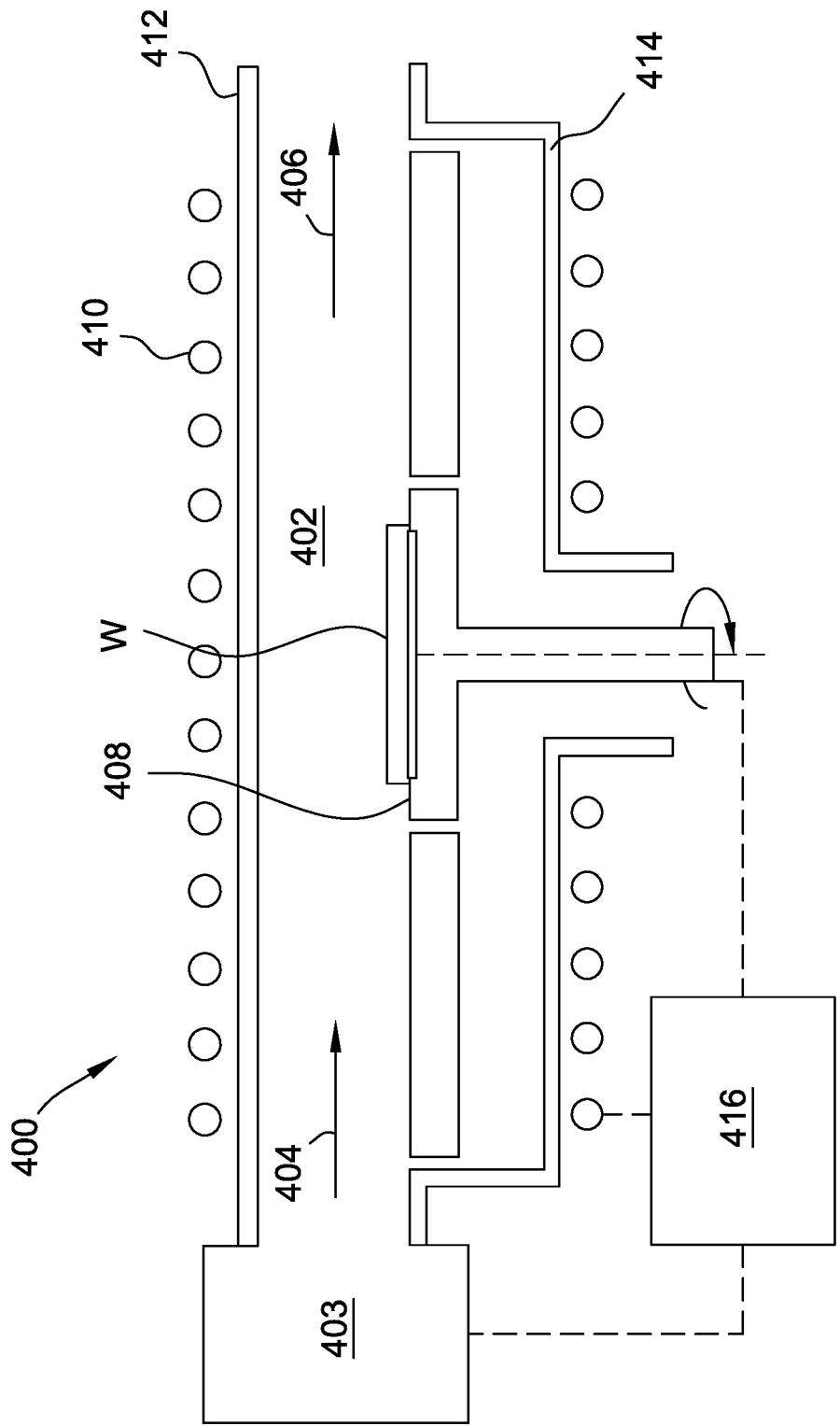
FIG. 4 is a partial schematic cross-section of an epitaxy apparatus.

Referring to FIG. 4, a partial cross-section of an example system for depositing a layer of material on the polished wafer is shown schematically and indicated generally at 400. In this example, system 400 is a gas phase epitaxial reactor 400. The reactor 400 is shown as a single wafer reactor, however, alternative reactors 400 operable with multiple wafers are contemplated and are within the scope of the present disclosure. Examples of systems for epitaxial deposition suitable for use as reactor 400 include EPI Centura reactors supplied by Applied Materials.

Reactor 400 includes a chamber 402. A gas manifold 403 supplies an inlet stream 404 of process gases (e.g., silane or chlorinated silane) into chamber 402. The process gases pass through chamber 402 and exit as outlet gases 406. A polished wafer W is positioned within chamber 402. A susceptor 408 is provided in chamber 402 and supports wafer W during deposition. The susceptor 408 is suitably constructed of opaque graphite coated with silicon carbide, though other materials are contemplated.

Reactor 400 also includes heating elements 410 that supply heat to chamber 402 to increase a temperature of elements within chamber 402, such as process gases, susceptor 408, and/or wafer W. Non-limiting examples of heating elements 410 include high intensity lamps, resistance heaters and/or inductive heaters. The heating elements 410 are suitably located in a portion of reactor 400 that is outside chamber 402. The interior of chamber 402 may be isolated from other portions of reactor 400 by a first wall 412 and a second wall 414. The first and second walls 412 and 414 are typically made of a transparent material to allow radiant heating light to pass into the chamber 402 and onto the wafer (and/or susceptor 408 supporting the wafer). For example, the first and second walls 412 and 414 may be constructed of transparent quartz. Quartz is generally transparent to infrared and visible light and is chemically stable under the reaction conditions of the deposition reaction.

Reactor 400 also includes a controller 416 that allows an operator to select and control process conditions of reactor 400 during the deposition process. For example, the operator may control, via the controller 416, process conditions such as, for example, a flowrate of the inlet stream 404 of gases supplied to chamber 402, a recipe of gases supplied in inlet stream 404, a deposition process time, a deposition process temperature, and a rotational speed of susceptor 408 during deposition.

During operation, a cleaning gas, such as hydrogen or a hydrogen and hydrogen chloride mixture, may be introduced as inlet stream 404 into chamber 402 prior to a deposition process. The cleaning gas contacts a front surface of the wafer W (i.e., a surface facing away from the susceptor 408) to pre-heat and clean the front surface of the wafer W. In some examples, the cleaning gas removes native oxide from the front surface, permitting the deposition layer to grow continuously and evenly on the surface during a subsequent deposition step. The process continues by introducing a deposition gas, for example, a vaporous silicon source gas, such as silane or a chlorinated silane, as inlet stream 404 into chamber 402 after the front surface of the wafer W is cleaned. The deposition gas contacts the front surface of the wafer W to deposit and/or grow a layer of material (e.g., silicon) on the front surface. The susceptor 408 rotates the wafer W during the process to allow the epitaxial layer to grow evenly on the front surface. A targeted thickness profile of the layer of material deposited and/or grown on front surface of the wafers W may be achieved by adjusting, via the controller 416, deposition process conditions such as a flowrate of the inlet stream 404 of gases supplied to chamber 402 during cleaning and/or deposition, a recipe of gases supplied in inlet stream 404 during cleaning and/or deposition, a cleaning and/or deposition process time, a cleaning and/or deposition process temperature, and a rotational speed of susceptor 408 during cleaning and/or deposition.

Referring back to FIG. 1, after the step 106 of depositing a layer of material on the polished wafer, the process 100 proceeds at step 108 where a surface profile of the epitaxial wafer is measured. As used herein, "epitaxial wafer" refers to a polished wafer that has undergone a subsequent deposition step to deposit and/or grow a layer of material on a surface of the wafer. As described above, various deposition processes are contemplated for use to deposition and/or grow the layer of material, and an epitaxial wafer within the scope of the present disclosure encompasses wafers that have a layer of material formed by any deposition process known in the art. Further, the measurement of the surface profile of the epitaxial wafer at step 108 may be performed using conventional metrology tools and may involve determining one or more wafer parameters (e.g., flatness) of the epitaxial wafer, as described above for the measurement of the polished wafer at step 104. For example, wafer flatness parameters of the epitaxial wafer such as GBIR, SFQR, SBIR, and ESFQR may be determined when the surface profile of the epitaxial wafer is measured at step 108.

If the epitaxial wafer does not have acceptable parameters for device fabrication, determined at step 108, the wafer must be scrapped because it has undergone irreversible processing and cannot be salvaged. Since the polished wafer is measured at step 104 and acceptable parameters are determined prior to the depositing step 106, unacceptable parameters of an epitaxial wafer measured at step 108 have been attributed to process conditions during depositing step 106. Conventional methods therefore attempt to minimize or prevent epitaxial wafers from having unacceptable parameters by controlling process conditions during the depositing step 106, such as those described above. One disadvantage associated with this technique is that requisite adjustments are not identified until it has been observed that at least one, and typically multiple, epitaxial wafers have unacceptable parameters. This results in unacceptable yield loss. Yield loss continues to increase as the identified adjustments are not made until even more wafers have undergone the depositing step 106. Moreover, it has been observed that requisite adjustments to improve yield of acceptable epitaxial wafers may be difficult to identify. This is because there may be little to no direct correlation between the thickness profile of the layer of material deposited and the resulting wafer parameter(s) of the epitaxial wafer. Rather, the acceptability of the wafer parameter(s) of an epitaxial wafer is frequently a consequence of whether the surface profile of the polished wafer matches a thickness profile of the layer of material deposited and/or grown on the epitaxial wafer.

Figure 5:
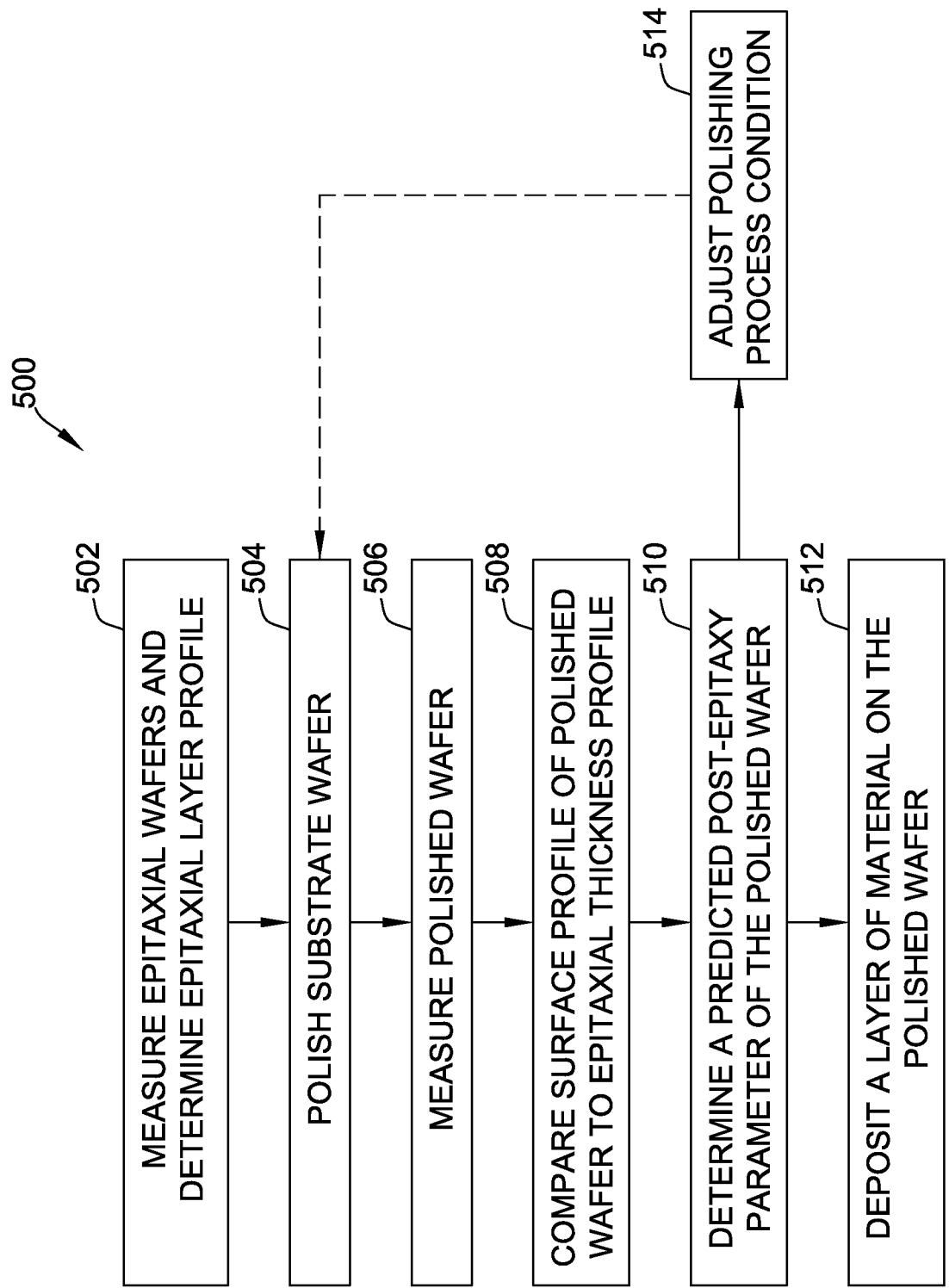
FIG. 5 is an example process for producing an epitaxial wafer having controlled flatness.

Referring to FIG. 5, an example process 500 for producing an epitaxial wafer having controlled flatness is shown. At step 502, one or more epitaxial semiconductor wafers are measured to determine an epitaxial deposition layer profile. The epitaxial wafers may be produced by the general process 100 shown in FIG. 1. For example, the epitaxial wafers are produced from substrate wafers that are polished (e.g., using DSP assembly 200 shown in FIG. 2 and/or SSP assembly 300 shown in FIG. 3), and then undergo a deposition process (e.g., using reactor 400 shown in FIG. 4). The epitaxial deposition layer profile determined by measuring the epitaxial wafers at step 502 may be a thickness profile of the layer of deposited material. The thickness profile of the layer of material may be determined by measuring a thickness profile of the polished wafers before material deposition (e.g., before deposition of an epitaxial layer) and a thickness profile of the epitaxial wafers after material deposition, and subtracting the thickness of the polished wafers from the thickness of the epitaxial wafers. The thickness profile of the polished wafers and/or epitaxial wafers may be measured using any suitable method available to those of skill in the art including, for example, using a conventional optical interferometric measurement or metrology tool as described above. Wafer parameters, such as flatness parameters including GBIR, SBIR, SFQR, and ESFQR, for example, of the polished wafers and/or epitaxial wafers can be determined based on the measured thickness profile of the respective wafer.

Measuring the epitaxial wafers at step 502 includes measuring a single epitaxial wafer and determining a thickness profile of the deposited material on the single epitaxial wafer. Alternatively, measuring the epitaxial wafers at step 502 may include measuring multiple (i.e., two or more) epitaxial wafers and determining a thickness profile of the deposited material on the multiple epitaxial wafers. In examples where multiple epitaxial wafers are measured at step 502, an average thickness profile may be determined based on the thickness profiles determined for each of the epitaxial wafers measured.

Additionally, in examples where multiple epitaxial wafers are measured at step 502, each of the multiple epitaxial wafers have suitably been produced using the same epitaxy apparatus (e.g., using reactor 400). In this respect, the average thickness profile determined from the multiple epitaxial wafers may indicate an average thickness profile produced by the epitaxy apparatus. Moreover, the multiple epitaxial wafers that are measured at step 502 may each have been processed in the epitaxy apparatus over a certain process time window. The process time window may be a time window during which conditions in the epitaxy apparatus are generally constant. For example, the process time window may be a day, several days, or a week. When conditions of the epitaxy apparatus change, a new process time window may begin and a new set of epitaxial wafers may be measured at step 502 to determine a thickness profile produced under the changed process conditions. For example, a new process time window may begin when a new susceptor (e.g., susceptor 408 of reactor 400 shown in FIG. 4) is installed.

The process 500 continues at step 504 where a substrate wafer is polished. Step 504 may include the same polishing operations described above for step 102 of process 100. For example, step 504 may include polishing the substrate wafer using DSP assembly 200 (shown in FIG. 2) and/or SSP assembly 300 (shown in FIG. 3) as described above. The substrate wafer that is polished at step 504 is a different wafer than the epitaxial wafers measured at step 502. The polished wafer obtained after step 504 is measured at step 506. Step 506 may include the same measuring operations described above for step 104 of process 100. For example, step 506 may include measuring a surface profile of the polished wafer using conventional metrology tools and determining one or more parameters of the polished wafer as described above.

Figure 6:
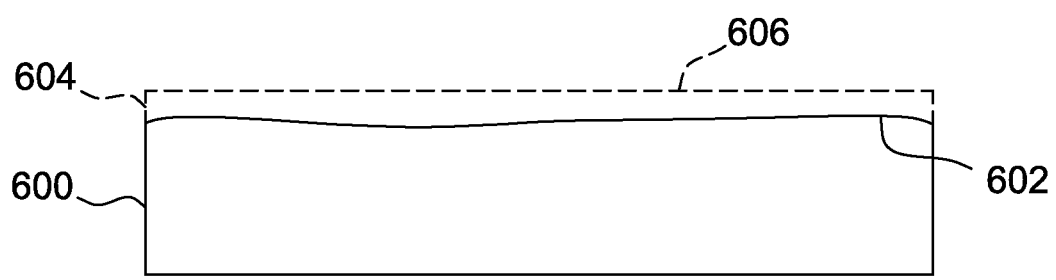
FIG. 6 is a schematic cross-section of a polished wafer with an epitaxial deposition layer profile superimposed on a front surface of the polished wafer.

A predicted post-epitaxy surface profile of the polished wafer obtained at step 504 is generated at step 508 by comparing the surface profile of the polished wafer that is measured at step 506 to the thickness profile of the epitaxial deposition layer profile determined by measuring the one or more epitaxial wafers at step 502. The comparison at step 508 may include stacking or superimposing the epitaxial deposition layer profile determined at step 502 on the surface profile of the polished wafer measured at step 506. To illustrate, FIG. 6 shows a schematic cross-section of a polished wafer 600 that includes a front surface 602 and an epitaxial deposition layer 604 having a determined thickness profile superimposed on the front surface 602. A top surface 606 of the wafer 600 has a predicted surface profile that is a result of a surface profile of the front surface 602 and the determined thickness profile of the epitaxial deposition layer 604 superimposed on the front surface.

Referring back to FIG. 1, a predicted post-epitaxy parameter of the polished wafer obtained at step 504 is determined at step 510 based on the comparison at step 508. The predicted post-epitaxy parameter may be determined based on the predicted surface profile of the polished wafer post-epitaxy that is generated by superimposing the epitaxial deposition layer on the surface of the polished wafer. For example, the predicted post-epitaxy parameter may be determined based on the predicted surface profile of the top surface 606 of the wafer 600 shown in FIG. 6. The predicted post-epitaxy parameter may include parameters described above, such as, for example, flatness parameters including one or more of SBIR, GBIR, and SFQR. However, any other predicted post-epitaxy parameters may be determined at step 510 based on the comparison at step 508.

The predicted post-epitaxy parameter may also be a predicted post-epitaxy near-edge parameter. The predicted post-epitaxy near-edge parameter may be, for example, a predicted post-epitaxy ESFQR or a predicted thickness variation along the near-edge profile of the post-epitaxy wafer. The predicted post-epitaxy near-edge parameter may be determined at step 510 based on a predicted post-epitaxy near-edge surface profile generated at step 508. The predicted post-epitaxy near-edge surface profile may be generated at step 508 by comparing a near-edge surface profile of the polished wafer measured at step 506 and a near-edge profile of the epitaxial deposition layer profile determined at step 502. The comparison of near-edge profiles may include comparing the near-edge thickness profile of the epitaxial deposition layer to parameters of the near-edge surface profile of the polished wafer such as, for example, a near-edge maximum thickness, a near-edge minimum thickness, or an edge-roll off.

Once the predicted post-epitaxy parameter is determined at step 510, the polished wafer may be sorted for further processing. More specifically, the polished wafer is sorted based on whether the predicted post-epitaxy parameter indicates that a subsequent epitaxy process using the epitaxy apparatus that produced the epitaxial deposition layer profile would produce a quality wafer for further device fabrication. For example, step 510 may include determining whether the predicted post-epitaxy parameter is within a predetermined threshold that sets a limit for acceptable post-epitaxy parameters or meets a predetermined specification for acceptable post-epitaxy parameters. For example, the post-epitaxy parameter may be a flatness parameter (e.g., SBIR, GBIR, SFQR, ESFQR, and/or a near-edge thickness variation), and step 510 may include determining that the predicted post-epitaxy flatness parameter meets a predetermined flatness specification (e.g., meets a predetermined specification for acceptable SBIR, GBIR, SFQR, ESFQR, and/or near-edge thickness variation). If the predicted post-epitaxy parameter indicates that the polished wafer will have acceptable parameters and quality following an epitaxy process in the epitaxy apparatus (e.g., the predicted post-epitaxy parameter is within the predetermined threshold or meets the predetermined parameter specification), the polished wafer may be subjected to an epitaxy process at step 512 using the epitaxy apparatus. For example, reactor 400 (shown in FIG. 4) may be used to deposit and/or grow a layer of material on the polished wafer, where the epitaxial deposition layer profile was determined at step 502 based on epitaxial wafers produced by reactor 400.

In some instances, the predicted post-epitaxy parameter indicates that the polished wafer will have an unacceptable flatness following an epitaxy process in the epitaxy apparatus. For example, it may be determined at step 510 that the predicted post-epitaxy parameter is not within the predetermined threshold or does not meet a predetermined parameter specification (e.g., a predicted post-epitaxy flatness parameter does not a predetermined flatness specification). The predicted post-epitaxy parameter is then used at step 514 to adjust polishing process conditions of the polishing operation used to obtain the polished wafer at step 504. The polishing process conditions may be adjusted as described above for DSP assembly 200 and SSP assembly 300. In the DSP assembly 200 (FIG. 2), for example, polishing process conditions such as the rotational speeds of one or both of the polishing heads 202 and 206, the polishing pressure between the polishing pads 210 and 214 and the respective surfaces of wafers W, a flowrate of the polishing slurry, a composition of the polishing slurry, a polishing process time, a polishing process temperature, a rotational speed of carrier plates 216 during polishing, and/or a thickness of the carrier plates 216 to increase or decrease a thickness of gap G, may be adjusted at step 514. In the SSP assembly 300 (FIG. 3), for example, polishing process conditions such as the rotational speeds of one or both of the polishing head 306 and turntable 308, the polishing pressure exerted by the polishing head 306, a flowrate of the polishing slurry, a composition of the polishing slurry, a polishing process time, and/or a polishing process temperature, may be adjusted at step 514.

The polishing process conditions may be adjusted at step 514 to account for a particular unacceptable predicted post-epitaxy parameter determined at step 510. For example, a predicted post-epitaxy near-edge parameter (e.g., a predicted post-epitaxy ESFQR or a predicted thickness variation along the near-edge profile of the post-epitaxy wafer) determined at step 510 may indicate that the polished wafer will have unacceptable near-edge flatness post-epitaxy. In this example, it can be determined that one or more parameters of the near-edge surface profile of the polished wafer (e.g., a near-edge maximum thickness, a near-edge minimum thickness, and/or an edge roll-off) does not match with a near-edge thickness profile of the epitaxial deposition layer. In this respect, the polishing process conditions for the polishing operation used at step 504 may be adjusted to control parameters of the near-edge surface profile of the polished wafer so that the near-edge surface profile better matches the near-edge thickness profile of the epitaxial deposition layer. For example, the polishing process conditions may be adjusted to control an edge roll-off of the polished wafer. Additionally or alternatively, the polishing process conditions may be adjusted to control other parameters of the near-edge surface profile. For example, the polishing process conditions may be adjusted to control a near-edge maximum thickness and/or a near-edge minimum thickness of the near-edge surface profile of the polished wafer. The parameters of the near-edge surface profile (e.g., edge roll-off, near-edge maximum thickness, or near-edge minimum thickness) may each be controlled to a targeted parameter that better matches the near-edge epitaxial deposition layer thickness profile.

After adjusting the polishing process conditions at step 512 based on the predicted post-epitaxy parameter, step 504 is repeated. In some examples, step 504 may be repeated under the adjusted polishing process conditions to re-polish the polished wafer that was obtained at step 504 and measured at step 506. Additionally or alternatively, step 504 may be repeated with the adjusted polishing process conditions to polish one or more substrate wafers other than the previously polished and measured wafer. After repeating step 504, steps 506-510 may also be repeated as necessary.

Figure 7:
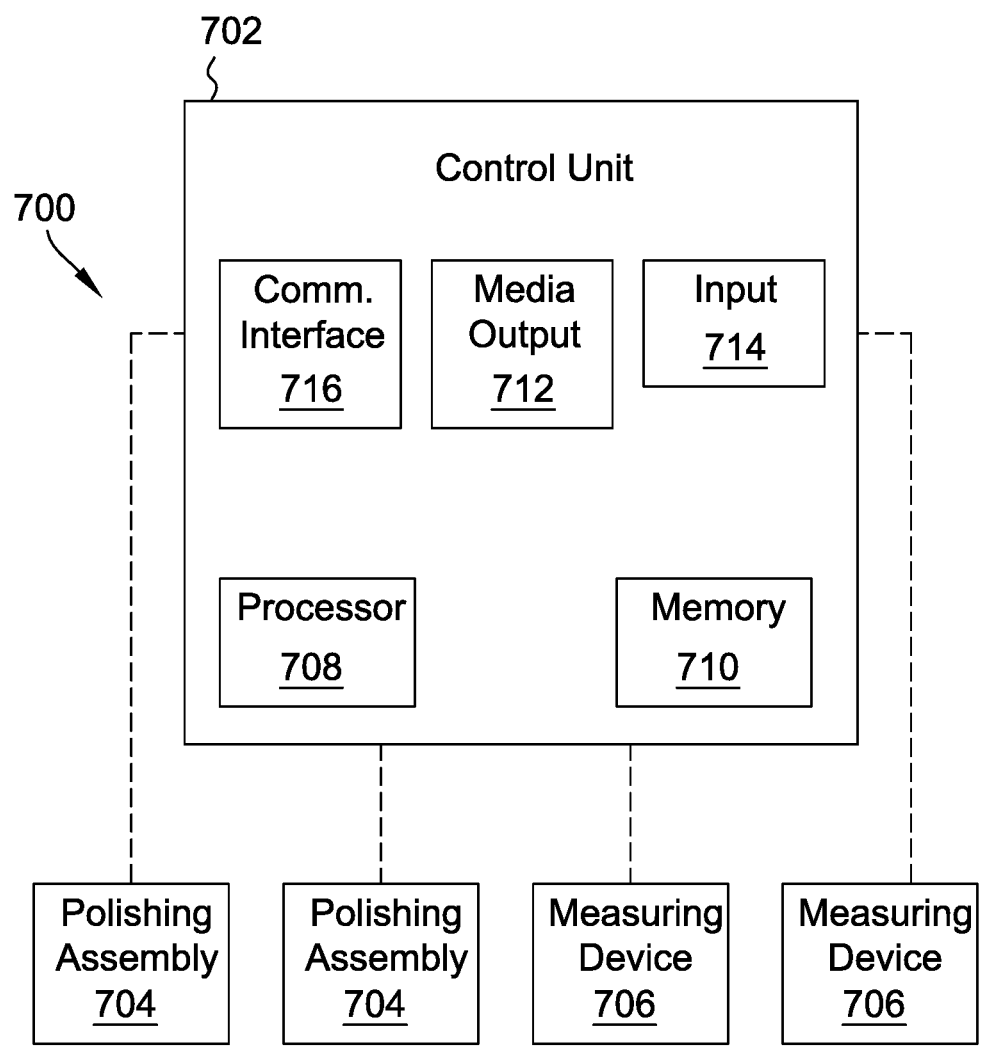
FIG. 7 is a block diagram of an example system for controlling flatness of an epitaxial wafer according to the process shown in FIG. 5.

Referring to FIG. 7, a block diagram of an example system 700 for controlling flatness of an epitaxial wafer according to the process 500 is shown. The system 700 includes a control unit 702 that is connected with one or more polishing assemblies 704 and one or more measuring devices 706. The polishing assemblies 704 may be a double-side polishing assembly, such as DSP assembly 300 (shown in FIG. 2), or a single-side polishing assembly, such as SSP assembly 300 (shown in FIG. 3). The one or more measuring devices 706 may be, for example, conventional metrology tools such as those described above.

The control unit 702 may be any known computing device or computer system and includes one or more processors 708 and a memory area 710. The processor 708 executes instructions stored in the memory area 710. The term "processor", as used herein, refers to central processing units, microprocessors, microcontrollers, reduced instruction set circuits (RISC), application specific integrated circuits (ASIC), logic circuits, and any other circuit or processor capable of executing the functions described herein. The above are examples only, and are thus not intended to limit in any way the definition and/or meaning of the term "processor." In addition, one or more processors 708 may be in one computing device or a plurality of computing devices acting in parallel.

Stored in the memory area 710 are, for example, processor-executable instructions for receiving and processing input from measuring devices 706 and controlling process conditions of polishing assemblies 704 based on the processed input received from measuring devices 706. The memory area 710 may include, but is not limited to, any computer-operated hardware suitable for storing and/or retrieving processor-executable instructions and/or data. The memory area 710 may include random access memory (RAM) such as dynamic RAM (DRAM) or static RAM (SRAM), read-only memory (ROM), erasable programmable read-only memory (EPROM), electrically erasable programmable read-only memory (EEPROM), and nonvolatile RAM (NVRAM). Further, the memory area 710 may include multiple storage units such as hard disks or solid state disks in a redundant array of inexpensive disks (RAID) configuration. The memory area 710 may include a storage area network (SAN) and/or a network attached storage (NAS) system. In some embodiments, the memory area 710 includes memory that is integrated in control unit 702. For example, control unit 702 may include one or more hard disk drives as the memory area 710. The memory area 710 may also include memory that is external to control unit 702 and may be accessed by a plurality of computing devices. The above memory types are for example only, and are thus not limiting as to the types of memory usable for storage of processor-executable instructions and/or data.

The control unit 702 also includes at least one media output component 712 for presenting information to a user. The media output component 712 is any component capable of conveying information to the user. In some embodiments, the media output component 712 includes an output adapter such as a video adapter and/or an audio adapter. An output adapter is operatively connected to the processor 708 and operatively connectable to an output device such as a display device (e.g., a liquid crystal display (LCD), organic light emitting diode (OLED) display, cathode ray tube (CRT), or "electronic ink" display) or an audio output device (e.g., a speaker or headphones). In some embodiments, at least one such display device and/or audio device is included in the media output component 712.

The control unit 702 may also include an input device 714 for receiving input from the user. The input device 714 may include, for example, a keyboard, a pointing device, a mouse, a stylus, a touch sensitive panel (e.g., a touch pad or a touch screen), a gyroscope, an accelerometer, a position detector, or an audio input device. A single component such as a touch screen may function as both an output device of the media output component 712 and the input device 714.

The control unit 702 may also include a communication interface 716, which may be communicatively connected to one or more remote devices. The communication interface 716 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

The control unit 702 receives measurement data of polished wafers and epitaxial wafers from the measuring devices 706. Based on this measurement data, the control unit 702 (e.g., via processor 708) generates a predicted post-epitaxy surface profile of a polished wafer and determines a predicted post-epitaxy parameter as described above. The control unit 702 may also determine adjustments that should be made to process conditions of one or more of the polishing assemblies 704 based on the predicted post-epitaxy parameter. The control unit 702 may then transmit a signal to the polishing assembly 704 corresponding to the determined adjustments. The polishing assembly 704 then implements the adjustments before polishing a subsequent wafer.

As compared to conventional methods for producing epitaxial wafers, methods of the present disclosure have several advantages. By comparing a determined epitaxial deposition layer profile to a surface profile of a polished wafer before the polished wafer undergoes epitaxy, wafer parameters of the polished wafer post-epitaxy may be predicted and used to determine whether a quality epitaxial wafer will be produced. Unacceptable parameters of the polished wafer post-epitaxy may be determined before irreversible processing occurs, allowing the wafers to be salvaged and re-processed. As a result, manufacturing costs and yield loss associated with low quality epitaxial wafers can be substantially reduced. The polishing process conditions may also be adjusted to consistently produce polished wafers that have a surface profile that better matches a subsequent deposited material profile, further increasing yield and reducing manufacturing costs associated with low quality epitaxial wafers.

EXAMPLES

Figure 8:
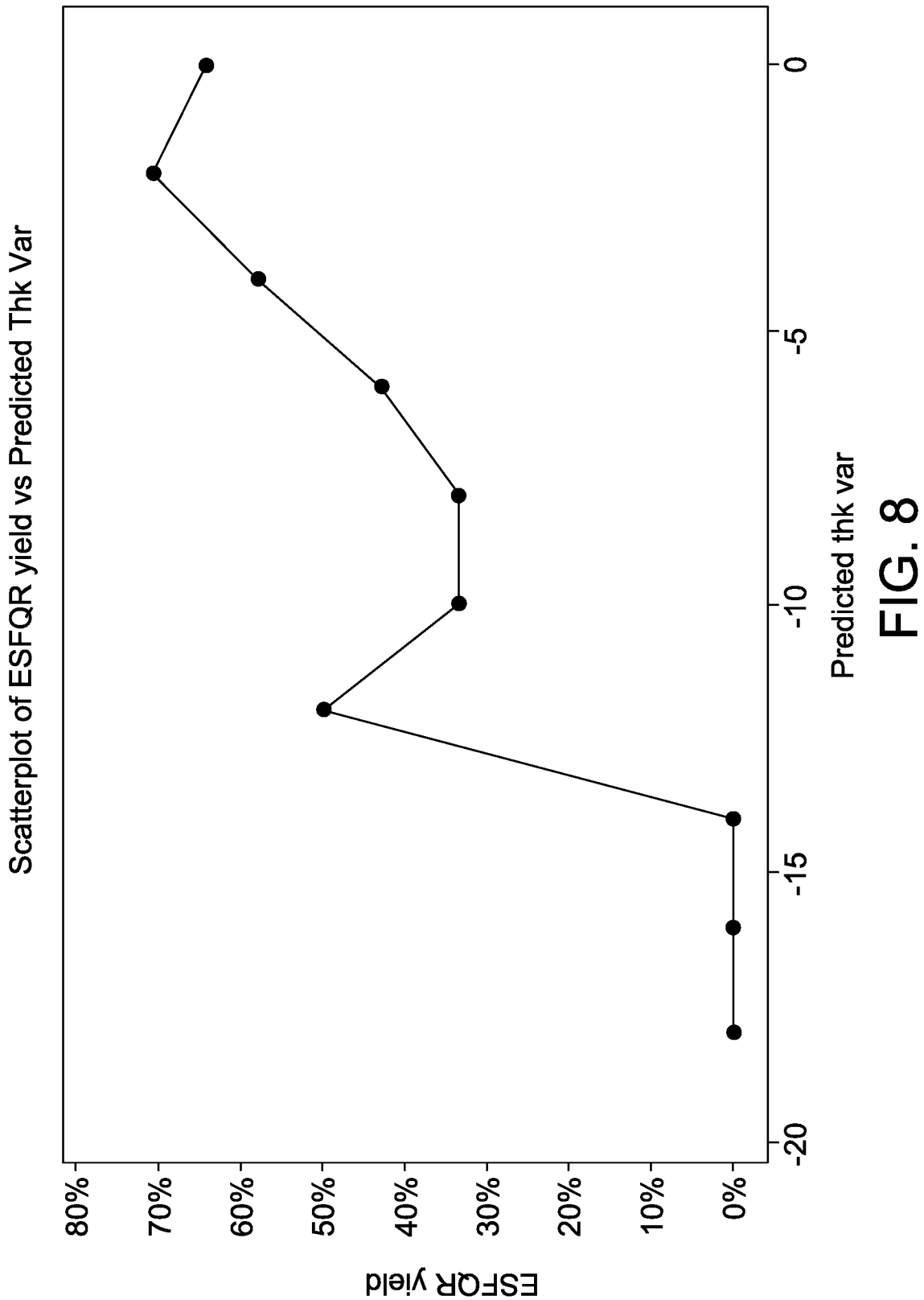
FIG. 8 is a scatterplot showing correlation between a predicted post-epitaxy parameter and yield rates of epitaxial wafers.

Referring to FIG. 8, a scatterplot of predicted post-epitaxy parameters versus yield rates of quality epitaxial wafers is shown. The predicted post-epitaxy parameter in this example was a predicted thickness variation along the near-edge profile of the post-epitaxy wafer. The predicted thickness variation was determined by matching a near-edge surface profile of polished wafers with a near-edge thickness profile of an epitaxial deposition layer. Yield rates were determined based on acceptable ESFQR parameters of the epitaxial wafers. As shown in FIG. 8, the predicted thickness variation parameter determined before epitaxy showed good correlation with acceptable ESFQR parameters of the epitaxial wafers. These results demonstrate that predicted post-epitaxy parameters can be used to produce quality epitaxial wafers and improve yield rates.

Figure 9:
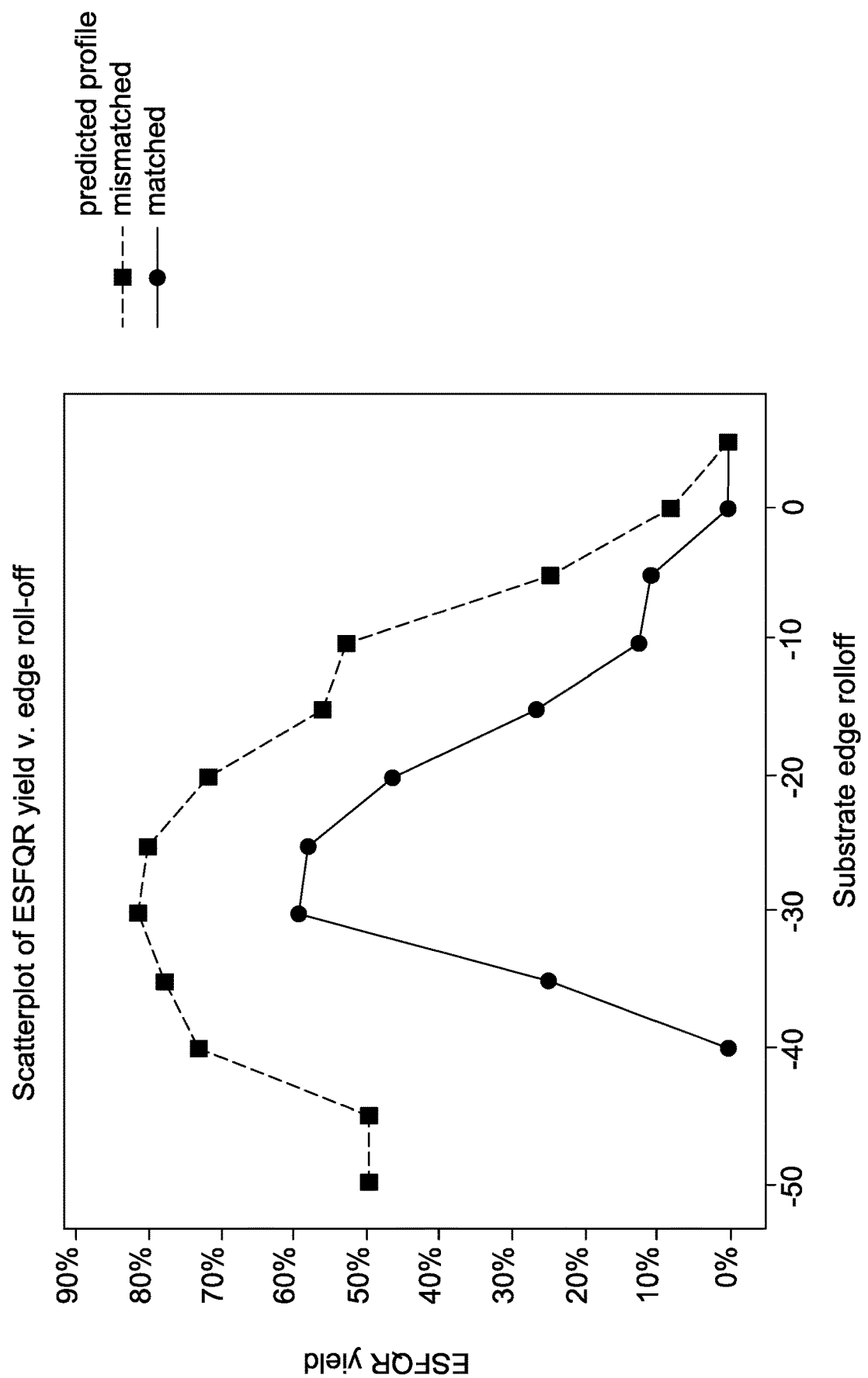
FIG. 9 is a scatterplot of yield rates of epitaxial wafers versus edge roll-off of polished wafers used to produce the epitaxial wafers, showing plots for epitaxial wafers that were produced with and without using a predicted post-epitaxy parameter.

Referring to FIG. 9, a scatterplot of yield rates of epitaxial wafers versus edge roll-off of polished wafers used to produce the epitaxial wafers is shown for epitaxial wafers that were produced with and without using a predicted post-epitaxy parameter. The predicted post-epitaxy parameter in this example was a predicted thickness variation along the near-edge profile of the post-epitaxy wafer. The predicted thickness variation was determined by matching a near-edge surface profile of polished wafers with a near-edge thickness profile of an epitaxial deposition layer. Yield rates were determined based on acceptable ESFQR parameters of the epitaxial wafers and increased when using a predicted post-epitaxy parameter. In particular, yield rates increased for all epitaxial wafers regardless of edge roll-off. Prior art processes control substrate edge roll-off to compensate for an epitaxial process that has a higher deposition rate near the edge of the wafer. These processes assumed that edge roll-off needed to be within a narrow range in order to produce a quality epitaxial wafer. FIG. 9 demonstrates that using a predicted post-epitaxy parameter improves yield rates even for epitaxial wafers produced from a polished wafer that has what was previously assumed to be an unacceptable edge roll-off. Therefore, by matching a polished wafer surface profile with an epitaxial deposition layer profile, a wider process window for edge roll-off control is achieved.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A method of producing an epitaxial semiconductor wafer, the method comprising:
  a) measuring, by at least one measuring device in communication with a controller, one or more first semiconductor wafers having epitaxial layers deposited thereon to determine an epitaxial deposition layer profile produced by an epitaxy apparatus;
  b) polishing a second semiconductor wafer, before epitaxial layers are deposited on the second semiconductor wafer, using a polishing assembly in communication with the controller, wherein the controller controls polishing of the second semiconductor wafer according to one or more process conditions;
  c) measuring, by the at least one measuring device, the polished second semiconductor wafer to determine a surface profile of the polished second semiconductor wafer;
  d) generating a predicted post-epitaxy surface profile of the polished second semiconductor wafer by comparing the determined surface profile of the polished second semiconductor wafer and the determined epitaxial deposition layer profile produced by the epitaxy apparatus;
  e) determining a predicted post-epitaxy parameter based on the predicted post-epitaxy surface profile;
  f) determining, by the controller and based on the predicted post-epitaxy parameter, one or more adjustments to the process conditions of the polishing assembly; and
  g) adjusting, by the controller and based on the determined one or more adjustments to the process conditions, one or more process conditions of the polishing assembly.

2. The method of claim 1, wherein the one or more process conditions comprises a polishing pressure, a composition of a polishing slurry, a polishing slurry flowrate, a polishing process time, a polishing process temperature, a rotational speed of a polishing head of the polishing assembly, a rotational speed of a carrier of the polishing assembly, or a rotational speed of a turntable of the polishing assembly.

3. The method of claim 1, further comprising polishing the second semiconductor wafer using the polishing assembly after adjusting the process condition of the polishing assembly.

4. The method of claim 3, further comprising depositing an epitaxial deposition layer on the polished second semiconductor wafer using the epitaxy apparatus.

5. The method of claim 1, wherein the polishing assembly comprises a double-side polishing assembly, and wherein the one or more process conditions comprises a thickness of a gap between a first polishing head and a second polishing head of the double-side polishing assembly, where the thickness of the gap is defined by a thickness of a carrier plate of the double-side polishing assembly.

6. The method of claim 1, wherein the one or more process conditions comprises a combination of a composition of a polishing slurry and at least one other process condition.

7. The method of claim 6, wherein the at least one other process condition comprises a polishing pressure, a polishing slurry flowrate, a polishing process time, a polishing process temperature, a rotational speed of a polishing head of the polishing assembly or a rotational speed of a turntable of the polishing assembly.

8. The method of claim 1, wherein measuring the one or more first semiconductor wafers having epitaxial layers deposited thereon to determine the epitaxial deposition layer profile comprises measuring a thickness distribution of epitaxial layers deposited on a single first semiconductor wafer.

9. The method of claim 1, wherein measuring the one or more first semiconductor wafers having epitaxial layers deposited thereon to determine the epitaxial deposition layer profile comprises measuring a thickness distribution of epitaxial layers deposited on multiple first semiconductor wafers.

10. The method of claim 1, wherein measuring the polished second semiconductor wafer to determine the surface profile of the polished second semiconductor wafer comprises determining a near-edge surface profile of the polished second semiconductor wafer, and wherein the predicted post-epitaxy parameter is a predicted post-epitaxy near-edge parameter.

11. The method of claim 1, wherein measuring one or more epitaxial semiconductor wafers to determine the epitaxial deposition layer profile comprises determining a thickness profile of an epitaxial deposition layer produced by the epitaxy apparatus, and wherein the predicted post-epitaxy parameter is a flatness parameter comprising at least one of SBIR, GBIR, SFQR, and ESFQR.

12. The method of claim 1, further comprising polishing a third semiconductor wafer after adjusting the one or more process conditions of the polishing assembly.

13. A method of producing an epitaxial semiconductor wafer, the method comprising:
  a) measuring, by at least one measuring device in communication with a controller, one or more first semiconductor wafers having epitaxial layers deposited thereon to determine a thickness profile of an epitaxial deposition layer produced by an epitaxy apparatus;
  b) polishing a second semiconductor wafer, before epitaxial layers are deposited on the second semiconductor wafer, using a polishing assembly in communication with the controller, wherein the controller controls polishing of the second semiconductor wafer according to one or more process conditions;
  c) measuring, by the at least one measuring device, the polished second semiconductor wafer to determine a near-edge surface profile of the polished second semiconductor wafer;
  d) determining a predicted post-epitaxy near-edge parameter of the polished second semiconductor wafer by comparing the determined near-edge surface profile of the polished second semiconductor wafer and the determined thickness profile produced by the epitaxy apparatus;

e) determining, by the controller, whether the predicted post-epitaxy near-edge parameter meets a predetermined parameter specification; and f) in response to determining that the predicted post-epitaxy near-edge parameter does not meet the predetermined parameter specification, determining, by the controller and based on the predicted post-epitaxy parameter, one or more adjustments to the process conditions of the polishing assembly and adjusting, by the controller and based on the determined one or more adjustments to the process conditions, one or more process conditions of the polishing assembly to control a parameter of the near-edge surface profile of the polished second semiconductor wafer.

14. The method of claim 13, wherein the parameter of the near-edge surface profile of the polished second semiconductor wafer comprises an edge roll-off, a near-edge maximum thickness, or a near-edge minimum thickness.

15. The method of claim 13, wherein the one or more process conditions comprises a polishing pressure, a composition of a polishing slurry, a polishing slurry flowrate, a polishing process time, a polishing process temperature, a rotational speed of a polishing head of the polishing assembly, a rotational speed of a carrier of the polishing assembly, or a rotational speed of a turntable of the polishing assembly.

16. The method of claim 13, further comprising polishing the second semiconductor wafer or a third semiconductor wafer using the polishing assembly after adjusting the one or more process conditions of the polishing assembly.

17. A method of producing an epitaxial semiconductor wafer, the method comprising:

a) measuring, by at least one measuring device in communication with a controller, one or more first semiconductor wafers having epitaxial layers deposited thereon to determine a thickness profile of an epitaxial deposition layer produced by an epitaxy apparatus;

b) polishing a second semiconductor wafer, before epitaxial layers are deposited on the second semiconductor wafer, using a polishing assembly in communication with the controller, wherein the controller controls polishing of the second semiconductor wafer according to one or more process conditions;

c) measuring, by the at least one measuring device, the polished second semiconductor wafer to determine a surface profile of the polished second semiconductor wafer;

d) superimposing, by the controller, the determined thickness profile of the epitaxial deposition layer on the determined surface profile of the polished second semiconductor wafer to determine a predicted post-epitaxy parameter of the polished second semiconductor wafer, wherein the predicted post-epitaxy parameter is a flatness parameter comprising at least one of SBIR, GBIR, SFQR, and ESFQR;

e) determining, by the controller, whether the predicted post-epitaxy parameter meets a predetermined parameter specification; and f) in response to determining that the predicted post-epitaxy parameter does not meet the predetermined parameter specification, determining, by the controller and based on the predicted post-epitaxy parameter, one or more adjustments to the process conditions of the polishing assembly and adjusting, by the controller and based on the determined one or more adjustments to the process conditions, one or more process conditions of the polishing assembly.

18. The method of claim 17, wherein the polishing assembly comprises a double-side polishing assembly, the method further comprising polishing the semiconductor wafer using the double-side polishing assembly after adjusting the one or more process conditions of the double-side polishing assembly.

19. The method of claim 17, further comprising, in response to the predicted post-epitaxy parameter meeting the predetermined parameter specification, depositing an epitaxial deposition layer on the polished second semiconductor wafer using the epitaxy apparatus.

20. The method of claim 17, wherein the one or more process conditions comprises a polishing pressure, a composition of a polishing slurry, a polishing slurry flowrate, a polishing process time, a polishing process temperature, a rotational speed of a polishing head of the polishing assembly, a rotational speed of a carrier of the polishing assembly, or a rotational speed of a turntable of the polishing assembly.

* * * * *